US012658233B2

(12) United States Patent
Billoint et al.

(10) Patent No.: US 12,658,233 B2
(45) Date of Patent: Jun. 16, 2026

(54) CIRCUIT FOR NON-DESTRUCTIVE READING OF FERROELECTRIC MEMORIES

(71) Applicant: COMMISSARIAT A L'ENERGIE ATOMIQUE ET AUX ENERGIES ALTERNATIVES, Paris (FR)

(72) Inventors: Olivier Billoint, Grenoble (FR); Laurent Grenouillet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 84 days.

(21) Appl. No.: 18/237,333

(22) Filed: Aug. 23, 2023

(65) Prior Publication Data

US 2024/0105246 A1 Mar. 28, 2024

(30) Foreign Application Priority Data

Sep. 28, 2022 (FR) ...................................... 2209851

(51) Int. Cl.
G11C 11/22 (2006.01)

(52) U.S. Cl.
CPC ........ G11C 11/2273 (2013.01); G11C 11/221 (2013.01); G11C 11/2259 (2013.01); G11C 11/2297 (2013.01)

(58) Field of Classification Search
CPC ............ G11C 11/2273; G11C 11/2259; G11C 11/2297; G11C 11/221
See application file for complete search history.

(56) References Cited

U.S. PATENT DOCUMENTS

| | | | | |
|---|---|---|---|---|
| 10,896,714 B1* | 1/2021 | Guo | ..................... | G11C 11/2275 |
| 2013/0300468 A1* | 11/2013 | Yamamoto | ........... | H03K 17/002 |
| | | | | 327/156 |
| 2021/0020222 A1* | 1/2021 | Guo | ..................... | G11C 11/2293 |
| 2021/0201976 A1* | 7/2021 | Guo | ..................... | G11C 11/2273 |
| 2022/0148630 A1* | 5/2022 | Kavala | ............... | H03K 19/0005 |

OTHER PUBLICATIONS

Okuno, et al., "1T1C FeRAM memory array based on ferroelectric HZO with capacitor under bitline", IEEE Journal of the Electron Devices Society, vol. 10, 2021.

* cited by examiner

*Primary Examiner* — Jay W. Radke

(74) *Attorney, Agent, or Firm* — BakerHostetler

(57) ABSTRACT

A data storage circuit includes a matrix of memory cells such that each memory cell comprises: a read circuit associated with at least one memory cell, comprising: a capacitive transimpedance amplifier stage configured to read a datum stored in a memory cell; the capacitive transimpedance amplifier stage comprising: an operational amplifier; a feedback capacitive impedance mounted between the output and the first input of the operational amplifier; a sequencer circuit configured to, following the reading of a datum corresponding to the second logic state, apply a control signal to the first input/output node having an amplitude lower than the first reference signal and maintain the selection transistor in an on state so as to replace, in the selected elementary storage component, a level of charges corresponding to the second logic state.

13 Claims, 13 Drawing Sheets

NVM

C3(EL2)

- Bias

+ Bias

NVM

C3(EL2)

C2

C2

C1(EL1)

C1(EL1)

Downward electrical bias
(x=0)

Upward electrical bias
(x=1)

SL

CM$_{ij}$

NVM

WL

T1

BL

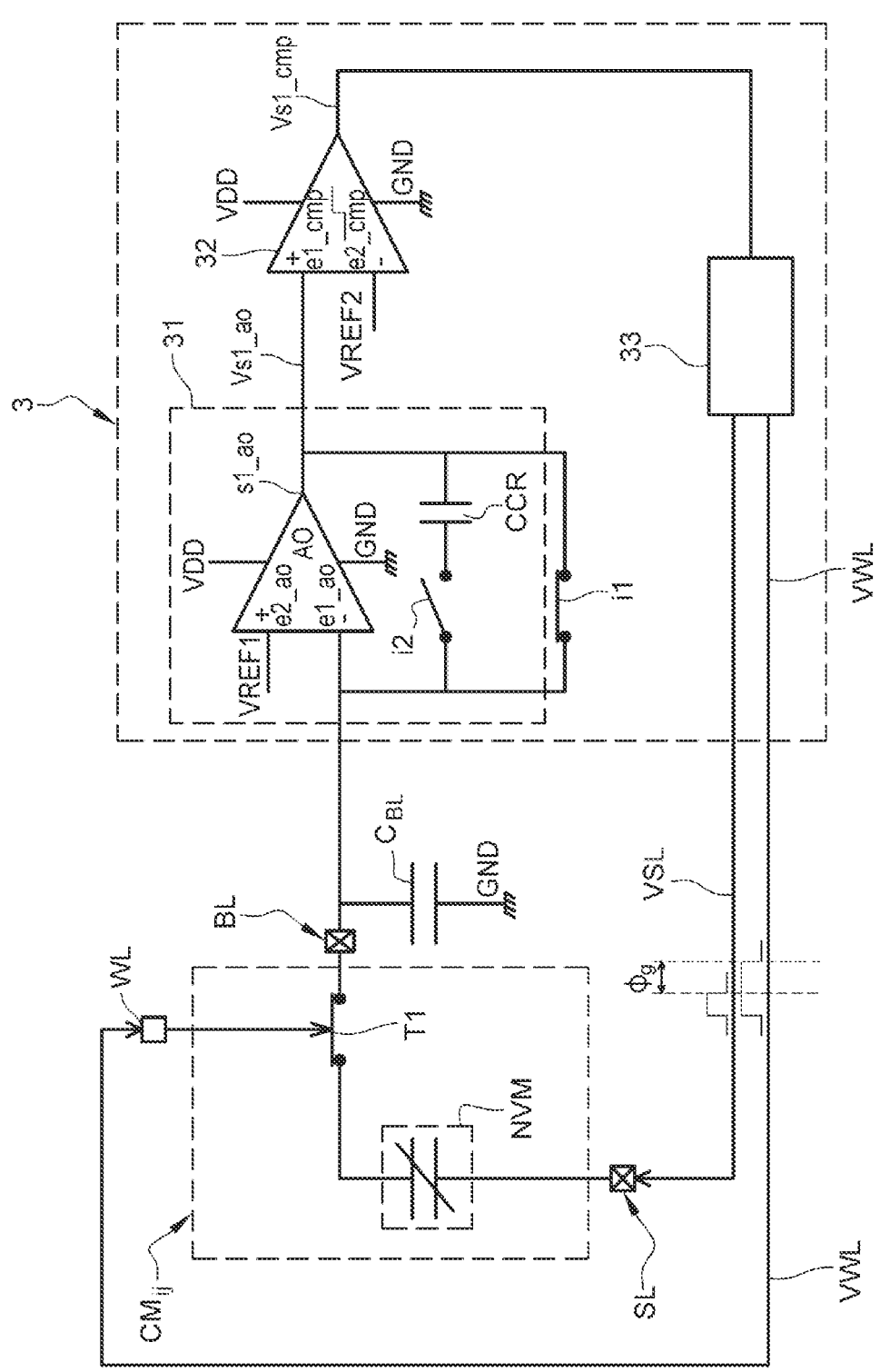
Fgi. 5d

CIRCUIT FOR NON-DESTRUCTIVE READING OF FERROELECTRIC MEMORIES

CROSS-REFERENCE TO RELATED APPLICATION

This application claims priority to foreign French patent application No. FR 2209851, filed on Sep. 28, 2022, the disclosure of which is incorporated by reference in its entirety.

FIELD OF THE INVENTION

The invention relates generally to data storage circuits based on ferroelectric non-volatile memory cells. More particularly, the invention relates to a circuit for the non-destructive reading of the ferroelectric memories.

BACKGROUND

Non-volatile memories have emerging solutions for implementing data storage means of a computer circuit. The ferroelectric memories with variable electric polarisation exhibit a strong endurance in write mode and a low write energy. FIG. 1a presents a structural example of an elementary NVM (acronym for non-volatile memory) component of a ferroelectric memory cell with variable electric polarisation, more specifically a component of FeRAM (acronym for ferroelectric random access memory) type.

In the example illustrated, the elementary component NVM is composed of the stacking of thin layers in the following order: a first layer C1 made of an electrically conductive material forming a first electrode EL1; a second layer C2 made of a dielectric and ferroelectric material and a third layer C3 made of electrically conductive material forming a second electrode EL2. The second layer C2 is referred to hereinafter in the description as the "central layer".

The stacking of thin layers forms a structure of MIM (metal-insulator-metal) type acting as a capacitive element with a capacitance C. The ferroelectric nature of the central layer C2 induces the following behaviour: when a positive electrical voltage is applied to the top electrode EL2, the bias of the electrical dipoles of the central layer is directed in a so-called "negative" direction (down). Conversely, when a positive electrical voltage is applied to the bottom electrode EL1, the bias of the electrical dipoles is directed in a so-called "positive" direction (up). The direction of the electric polarisation in the central layer C2 corresponds to a state of equilibrium that is maintained even in the absence of the electrical field induced by the voltage applied to one of the electrodes EL1 or EL2, hence the operation in ferroelectric memory mode.

Thus, the following convention is chosen by way of example: when a memory component NVM is configured to store a binary datum in the low logic state (datum x=0), a write electrical voltage is applied temporarily to the top electrode EL2 (illustrated by + bias) so as to obtain a bias of electrical dipoles directed in a "negative" direction in the central layer C2. Conversely, when a memory component NVM is configured to store a binary datum in the high logic state (x=1), a write electrical voltage is applied temporarily to the bottom electrode EL1 (illustrated by − bias) so as to obtain a bias of electrical dipoles directed in a "positive" direction in the central layer C2.

However, the operation of reading a ferroelectric non-volatile memory is a destructive operation. Indeed, in a read mode access, the elementary component NVM receives a read electrical voltage on the top electrode so as to rewrite it to a low logic state (x=0). The dynamics of the transition following the application of the read voltage are then observed. If the electrical dipoles of the central layer are previously biased with an orientation in a "positive" direction (x=1), a relatively significant quantity of electrical charges will be emitted by the device during the transition. Conversely, if the electrical dipoles of the central layer are previously biased with an orientation in a "negative" direction (x=0), the quantity of charges delivered during the transition is less. The result thereof is that the read procedure consists in estimating the quantity of charges emitted when biased at a low logic state (x=0) and that it therefore erases the logic value of the stored datum.

In this context, one technical problem to be resolved is the destruction of the logical content of a ferroelectric memory cell with variable electric polarisation following a read operation.

Moreover, increasing the number of ferroelectric non-volatile memory cells induces an increase in the stray capacitance at the bit lines BL. The increase in the value of said stray capacitance induces a drastic reduction of the sensitivity of the known read circuits.

Furthermore, the increasing density of the memory matrices used in embedded systems necessitates reducing the surface area occupied by each elementary component NVM. That results in a reduction of the electrical capacitance of each elementary component NVM. That induces a reduction of read sensitivity of this type of memory.

To sum up, several technical problems arise concerning the reading of the ferroelectric memories with variable electric polarisation, namely:

The destruction of the logical content of the memory cell following a read, and more particularly for a high logic state "x=1".

The reduction of the read sensitivity with the widening of the memory cell matrices and/or the increased density of the memory matrices through the reduction of the size of the elementary storage components.

The scientific publication entitled "1T1C FeRAM memory array based on ferroelectric HZO with capacitor under bitline" by J. Okuno et al. presents a read circuit for a plurality of memories of FeRAM type. The solution presented is based on a divider capacitive bridge connected to the bitline of the memory cell to be read. The voltage variation at the output of the capacitive divider bridge with respect to a reference signal is amplified by a detection amplifier. The amplitude of said variation depends directly on the value of the stray capacitance at the bitline, which results in the loss of read accuracy for the reasons detailed previously. Furthermore, in Okuno's solution, the amplitude of said variant depends directly on the value of the capacitance of the elementary component, which reduces the read sensitivity for the more dense matrices. Another drawback of the prior art solution consists of the destructive aspect of the operation of reading a memory cell which stores a high logic state.

Response to the Problem and Solution Provided

To address the technical problems discussed above, linked to the reading of the ferroelectric nonvolatile memories, the invention proposes a read circuit comprising a capacitive transimpedance amplifier (CTIA) stage. The read circuit according to the invention thus comprises a capacitive feedback impedance that makes it possible to directly read the quantity of charges contained in the elementary ferroelectric storage component and not read a variation of voltage on the bitline. This solution thus makes it possible to perform a read operation whose accuracy is independent of the stray capacitances of the bitlines. That thus makes it possible to construct matrices of larger size without being penalized by a reduction of the memory window.

Furthermore, reading in the domain of the charges makes it possible to limit the variations of the electrical potential at the bitlines. That offers the advantage of a considerable reduction of the dynamic electrical consumption of the storage circuit.

Furthermore, the read circuit according to the invention makes it possible to rewrite the datum read ($x=1$) in the memory cell after each read operation so as to perform a nondestructive read operation. The rewrite operation is totally integrated by the read circuit according to the invention. There is no need to copy the data into buffer memories before the read, or to transfer said data to external circuits. That makes it possible to reduce the complexity of implementation of the storage circuit. That also makes it possible to reduce the energy consumption of the storage circuit through a limitation of the data exchanges at the input and/or output of the storage circuit.

SUMMARY OF THE INVENTION

The subject of the invention is a data storage circuit comprising:
- a matrix of memory cells such that each memory cell comprises:
  - an elementary storage component of ferroelectric type with variable electric polarisation and having a first electrode and a second electrode;
  - a first input/output node connected to the second electrode; a second input/output node; a selection node;
  - a selection transistor having a gate connected to the selection node and linking the first electrode to the second input/output node;
  - wherein each memory cell can have a first or a second logic state corresponding respectively to different levels of charges stored in the elementary storage component;
- a read circuit associated with at least one memory cell, comprising:
  - a capacitive transimpedance amplifier stage configured to read a datum stored in a selected memory cell via the switching on of the corresponding selection transistor by applying a selection signal to the selection node; said capacitive transimpedance amplifier stage comprising:
    - an operational amplifier having: a first input connected to the second input/output node of the associated memory cell, a second input for receiving a first reference signal; and an output for supplying an analog read signal;
    - a feedback capacitive impedance mounted between the output and the first input of the operational amplifier;
  - a sequencer circuit configured to, following the reading of a datum corresponding to the second logic state, apply a control signal to the first input/output node having an amplitude lower than the first reference signal and maintain the selection transistor in an on state so as to replace, in the elementary storage component of the selected memory cell, a level of charges corresponding to the second logic state.

According to a particular aspect of the invention, said sequencer circuit is configured to, during the read, apply a control signal to the first input/output node having an amplitude substantially equal to the first reference signal so as to create a transfer of charges from the elementary storage component of the selected cell to said capacitive transimpedance amplifier stage.

According to a particular aspect of the invention, said first logic state corresponds to a non-charged state of an elementary storage component. The sequencer circuit is such that, following the reading of a datum corresponding to a first logic state, said sequencer circuit is configured to switch off said selection transistor of the selected memory cell before modifying the control signal on the first input/output node to a new value, to maintain the memory cell that has just been read in a non-charged state.

According to a particular aspect of the invention, the read circuit further comprises a comparator having:
- a first input connected to the output of the operational amplifier;
- a second input for receiving a second reference signal;
- and an output for supplying a digital read signal.

According to a particular aspect of the invention, the control signal is a first pulse; the selection signal is a second pulse; the sequencer circuit is configured to reduce the duration of the first pulse with respect to that of the second pulse following the reading of a datum corresponding to a high logic state.

According to a particular aspect of the invention, the read circuit further comprises a reset switch mounted between the output and the first input of the operational amplifier.

According to a particular aspect of the invention, the read circuit further comprises a first feedback activation switch between the feedback capacitive impedance and the first input of the operational amplifier.

According to a particular aspect of the invention, the data storage circuit further comprises a read activation switch between the first input of the operational amplifier and the second input/output node of the associated memory cell.

According to a particular aspect of the invention, the read circuit is configured to also perform, before the reading of said associated memory cell:
- a reset step for discharging the feedback capacitive impedance and biasing the first input of the operational amplifier to the first reference signal.

According to a particular aspect of the invention, the amplitude of the first reference signal lies within the interval [VDD/2−VDD/4; VDD/2+VDD/4] with VDD a power supply voltage of the data storage circuit.

According to a particular aspect of the invention, the storage circuit comprises at least one elementary storage component that can be configured according to an operating configuration corresponding to a resistive memory with variable conductive filament:

The read circuit further comprising:
- a feedback resistive impedance mounted between the output and the first input of the operational amplifier;
- a second feedback activation switch between the feedback resistive impedance and the first input of the operational amplifier.

According to a particular aspect of the invention, the matrix of memory cells is composed of N rows and M columns of memory cells such that:

the memory cells belonging to one and the same column have first input/output nodes interconnected, and second input/output nodes interconnected;

the memory cells belonging to one and the same row have selection nodes interconnected.

According to a particular aspect of the invention, the elementary storage component is of FeRAM type or of ferroelectric tunnel junction (FTJ) type.

BRIEF DESCRIPTION OF THE DRAWINGS

Other features and advantages of the present invention will emerge more clearly on reading the following description in relation to the following attached drawings.

FIG. 5d illustrates an electrical circuit diagram of a first configuration of the read circuit according to the invention in a rewriting step.

FIG. 6b illustrates a functional diagram of the architecture of a second embodiment of the data storage circuit according to the invention.

FIG. 7c illustrates a timing diagram of the control signals of the resistive memory cell when a memory cell is read by the read circuit according to the invention.

DETAILED DESCRIPTION

Figures 1A, 1B:
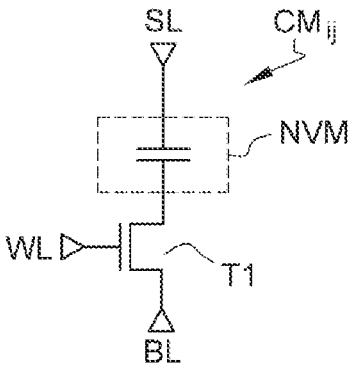
FIG. 1a illustrates a cross-sectional view of an example of an elementary component of a ferroelectric memory cell with variable electric polarisation that is compatible with the invention. This figure is already described.
FIG. 1b illustrates an electrical modelling of a ferroelectric memory cell with variable electric polarisation that is compatible with the invention.

FIG. 1a, already described, illustrates an elementary component NVM (a non-volatile memory element component) of FeRAM type that is compatible with the invention. It has to be stressed that it is also possible to produce the invention with elementary components of ferroelectric tunnel junction (FTJ) type, and any other type of ferroelectric nonvolatile memory technology with variable electric polarisation.

FIG. 1b illustrates an electrical modelling of a ferroelectric memory cell $CM_{ij}$ with variable electric polarisation that is compatible with the invention. The memory cell $CM_{ij}$ comprises an elementary memory component NVM, a selection transistor T1, a first input/output node SL, a second input/output node BL and a selection node WL. The memory cell $CM_{ij}$ is intended to be incorporated in a matrix comprising a plurality of bitlines, a plurality of word lines and a plurality of source lines. The first input/output node SL is intended to be connected to a source line associated with the memory cell $CM_{ij}$. The second input/output node BL is intended to be connected to a bitline associated with the memory cell $CM_{ij}$. The selection node WL is intended to be connected to a word line associated with the memory cell $CM_{ij}$.

In a memory cell $CM_{ij}$, the first input/output node (SL) is connected to the second electrode EL2 of the elementary memory component NVM. The selection transistor T1 has a gate connected to the selection node WL. The selection transistor T1 links the first electrode EL1 of the elementary memory component NVM to the second input/output node BL. The elementary component NVM behaves as a capacitive element exhibiting a variable capacitance depending on the direction of the electric polarisation of the central ferroelectric layer C2. Thus, the memory cell $CM_{ij}$ is modelled by a compact architecture 1C1T. That allows a direct action on the electrodes EL1 and EL2 of the capacitive element when the transistor T1 is in the on state.

Figure 2:
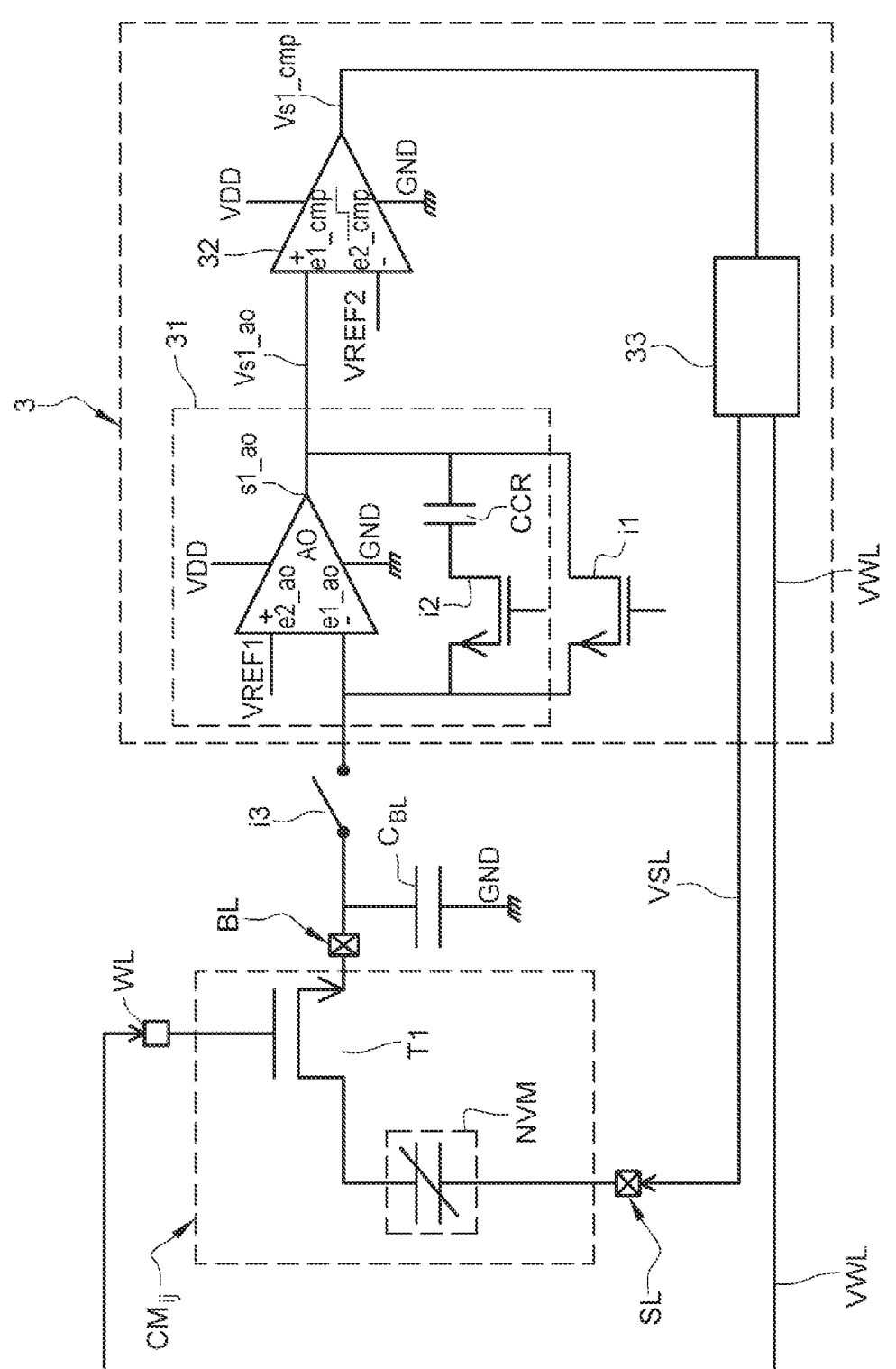
FIG. 2 illustrates an electrical circuit diagram of a first embodiment of the read circuit according to the invention connected to a ferroelectric memory cell with variable electric polarisation.

FIG. 2 illustrates an electrical circuit diagram of a first embodiment of the read circuit 3 according to the invention connected to a ferroelectric memory cell $CM_{ij}$ with variable electric polarisation.

The read circuit 3 is connected to the second input/output node BL of the memory cell to be read $CM_{ij}$ through a read activation switch 3. The read activation switch i3 makes it possible to isolate the node BL from the read circuit 3 if necessary. As a nonlimiting illustrative example, the memory cell $CM_{ij}$ has the same architecture described previously. The stray capacitance $C_{BL}$ seen by the second input/output node BL is represented here in order to make it easier to understand the invention.

The read circuit 3 comprises a capacitive transimpedance amplifier stage 31, a comparator 32, a sequencer circuit 33 and a reset switch i1.

The capacitive transimpedance amplifier stage 31 comprises an operational amplifier AO associated with a feedback capacitive impedance (CCR). The operational amplifier AO has a first input e1_ao connected to the second input/output node BL of the associated memory cell; a second input e2_ao for receiving a first reference signal VREF1; and an output s1_ao for supplying an analog read signal Vs1_ao. The feedback capacitive impedance CCR is mounted between the output s1_ao and the first input e1_ao of the operational amplifier. This type of setup makes it possible to perform a direct read of the quantity of charges contained in the elementary component NVM and not a read of a voltage variation on the node BL. This setup thus makes it possible to perform a read operation, the accuracy of which is independent of the stray capacitance $C_{BL}$.

The operational amplifier AO has a dual function:

maintaining the node BL at a fixed potential equal to the potential of the first reference signal VREF1 when the read activation switch i3 is on, generating an analog read signal Vs1_ao having an amplitude dependent on the quantity of charge transmitted from the elementary component NVM to the feedback capacitive impedance CCR in a read operation.

The function of the feedback capacitive impedance CCR is to convert the quantity of charges supplied by the elementary component NVM (that can be likened to a capacitive element) into an electrical voltage applied between the output s1_ao and the input e1_ao in a read operation.

Optionally, the read circuit comprises a first feedback activation switch i2 between the feedback capacitive impedance CCR and the first input e1_ao of the operational amplifier.

The comparator 32 has a first input e1_cmp connected to the output s1_ao of the operational amplifier; a second input e2_cmp for receiving a second reference signal VREF2; and an output s1_cmp for supplying a digital read signal Vs1_cmp resulting from the comparison of the analog read signal Vs1_ao with the second reference signal VREF2.

The comparator 32 and the operational amplifier AO are each biased by a power supply voltage VDD and the electrical ground GND.

The sequencer circuit 33 is configured to control the application:

of a write and read control signal VSL on the first input/output node SL of the associated memory cell;

and of a selection signal VWL on the selection node WL of the associated memory cell.

It is a circuit configured according to a state machine in order to adapt the characteristics of the signals VSL and WL according to the digital read signal Vs1_cmp. The action of the sequencer 33 on the signals VSL and WL will be detailed in a subsequent section. As a nonlimiting example, it is possible to envisage implementing the sequencer circuit 33 using a microcontroller incorporated in the memory circuit. Advantageously, the sequencer 33 makes it possible to put in place a feedback loop that makes it possible to perform a rewrite operation by the read circuit itself. That makes it possible to overcome destructive read problems without making the circuit more complex. Furthermore, the action of the sequencer makes it possible to perform the rewrite without transferring the data to external buffer memories.

The reset switch i1 is mounted between the output s1_ao and the first input e1_ao of the operational amplifier. When the reset switch i1 is in the on (closed) state, the feedback capacitive impedance CCR is discharged. This discharge also induces the reset of the analog read signal Vs1_ao to a potential equal to that of the first reference signal VREF1.

Advantageously, the closing of the reset switch i1 makes it possible to dissipate the charges accumulated on the second input/output node BL because of the leakage currents. Indeed, for the advanced technological nodes, there are increased leakage currents originating from the selection transistors connected to the second input/output node BL. These leakage currents lead to an accumulation of charges in the stray capacitance $C_{BL}$. That induces potential fluctuations at the second input/output node BL. Hence the specific benefit of the reset switch i1 in this particular case.

All of the switches i1, i2 and i3 are controlled by control means that are not represented to simplify the illustration.

Figure 3A:
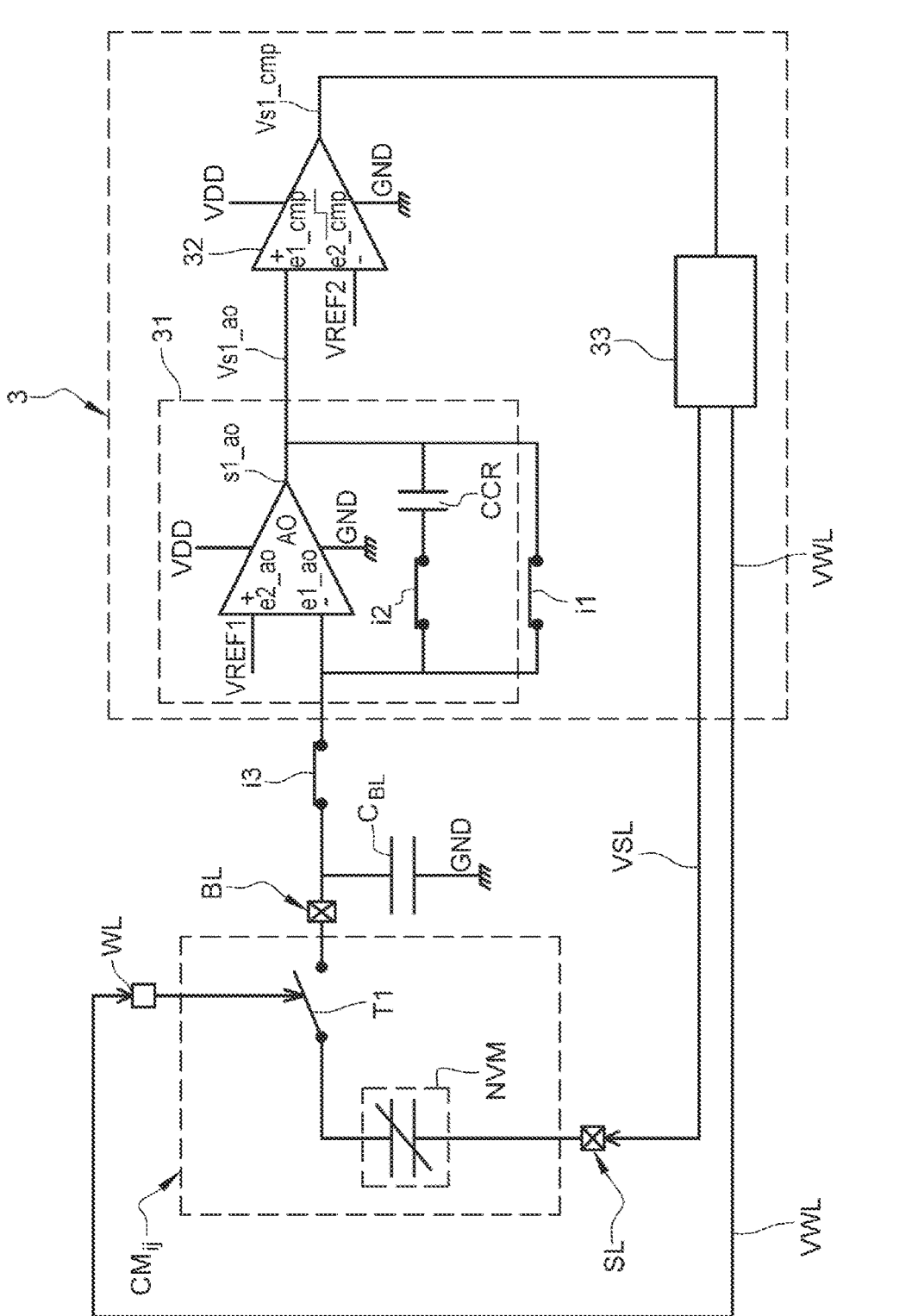
FIG. 3a illustrates an electrical circuit diagram of the configuration of the read circuit according to the invention in an initialization step.

The switches i1, i2 and i3 are produced by CMOS transistors for example. The read circuit 3 is configured to perform the following steps:

The first step (i) is a reset step obtained by the configuration illustrated by FIG. 3a. The reset switch i1, the feedback activation switch i2 and the read activation switch i3 are closed. The sequencer 33 generates a selection signal VWL so as to set the selection transistor T1 to an off (open) state. The sequencer 33 generates a write and read control signal VSL on the first input/output node SL equal to the electrical ground.

This step (i) makes it possible to discharge the feedback capacitive impedance CCR and to bias the first input e1_ao of the operational amplifier to the first reference signal VREF1. Thus, following the reset, the input/output node BL and the output s1_ao are biased to the first reference signal VREF1 (VBL=Vs1_ao=VREF1); the voltage at the terminals of the feedback capacitive impedance CCR is zero; and the output of the comparator s1_cmp is at a low logic state (Vs1_cmp=0).

Figure 3B:
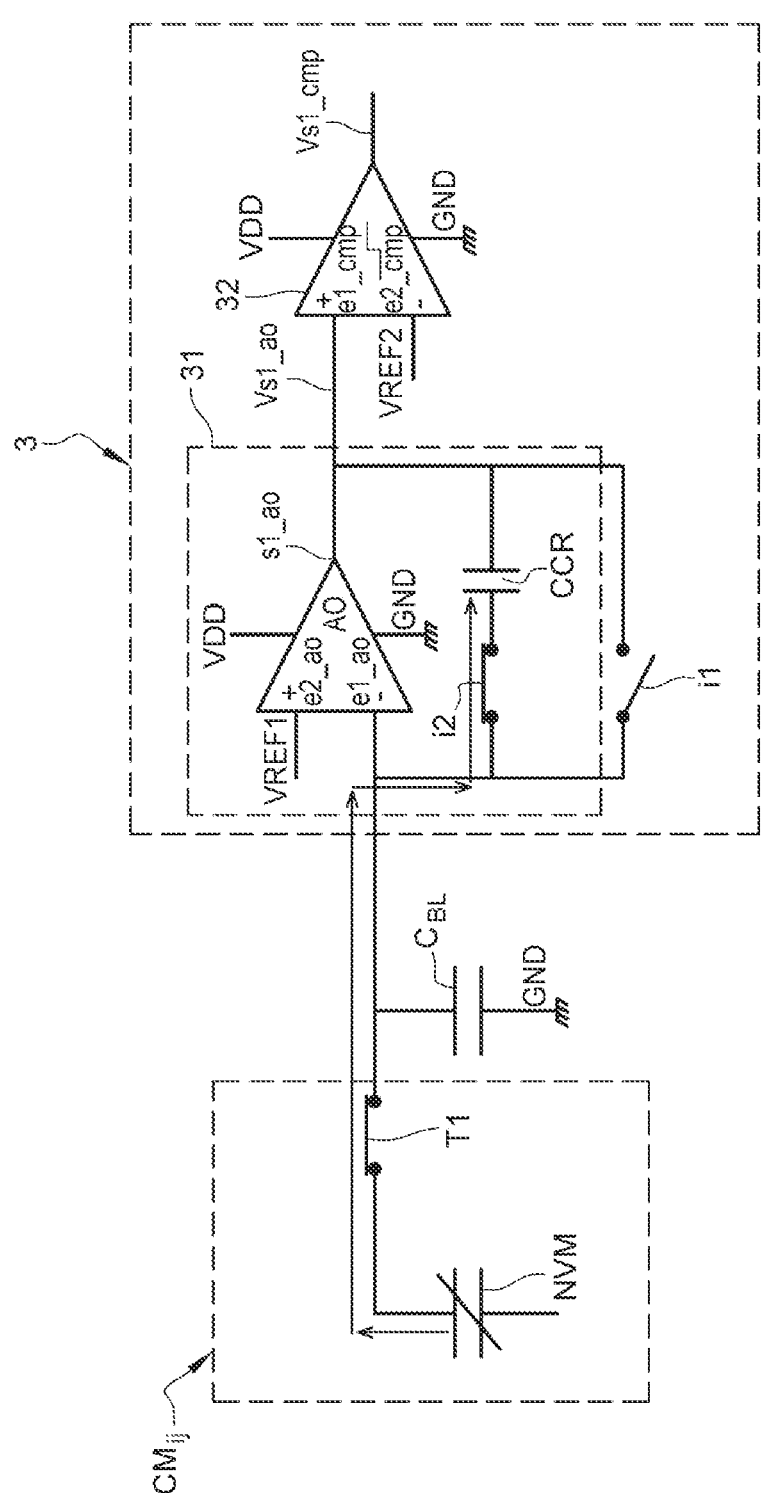
FIG. 3b illustrates an electrical circuit diagram of the configuration of the read circuit according to the invention in a read step.
Figure 3C:
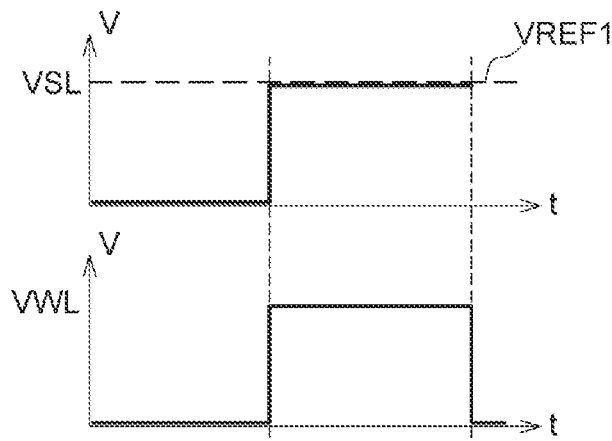
FIG. 3c illustrates a timing diagram of the control signals of the memory cell during a step of reading by the read circuit according to the invention.

The second step (ii) is a read step obtained by the configuration illustrated by FIG. 3b. FIG. 3c illustrates a timing diagram of the signals VSL and VWL supplied by the sequencer 33 in a read step ii). The reset switch i1 is open and the switches i2 and i3 are closed (on state).

The sequencer 33 is configured during this step to apply a selection signal VWL that makes it possible to set the selection transistor T1 to the on state (a rising edge in the case of an NMOS is illustrated here). The result thereof is the creation of a connection path between the elementary component NVM and the feedback capacitive element CCR.

Furthermore, the sequencer 33 is configured to apply a positive read control signal VSL to the first input/output node SL. The result thereof is the application of a quasi-zero potential difference at the terminals of the elementary component NVM.

Thus, the combination of the quasi-zero voltage at the terminals of the elementary component NVM and its connection with the feedback capacitive element CCR induces a transfer of the charges previously stored in the elementary component NVM to the feedback capacitive element CCR. The quantity of charge transferred depends on the logic state previously stored in the memory $CM_{ij}$. That induces a variation of the electrical voltage VCCR at the terminals of the feedback capacitive element CCR. The value of the electrical voltage at the terminals of the feedback capacitive element CCR depends on the quantity of charges supplied by the elementary component NVM to the feedback capacitive element CCR. That induces a variation of the analog output signal Vs1_ao which changes to VREF1−VCCR.

In the case where x=1 is stored in the elementary component NVM, Vs1_ao=VREF1−VCCR<VREF2 is obtained, with VCCR of the order of a few hundreds of millivolts. Thus, Vs1_cmp=VDD is obtained, corresponding to a high logic level. Conversely, in the case where x=0 is stored in the elementary component NVM, Vs1_ao=VREF1−VCCR>VREF2 is obtained, and therefore Vs1_cmp=GND corresponding to a low logic level.

It is stressed here that the charges are transferred totally to the feedback capacitive element CCR in this step. The stray capacitance $C_{BL}$ does not receive these charges because it is maintained at a voltage equal to VREF1 by virtue of the operational amplifier AO throughout the operation. The read circuit 3 according to the invention thus makes it possible to perform a read operation in the domain of charges independent of the value of the stray capacitance $C_{BL}$.

Figure 4:
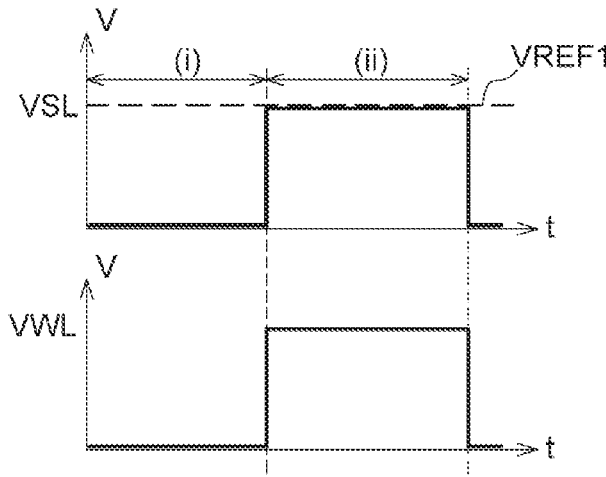
FIG. 4 illustrates a timing diagram of the control signals of the memory cell following the reading of a low logic state (x=0) by the read circuit according to the invention.

The third step (iii) consists in rewriting the logic datum previously read by the read circuit 3. Remember that the rewrite operation is required only in the case where the datum read corresponds to a high logic state. FIG. 4 illustrates a timing diagram of the control signals of the memory cell $CM_{ij}$ following the reading of a low logic state (x=0) by the read circuit 3. In this case, the sequencer 33 receives the digital read signal Vs1_cmp=0. In response to this result, the sequencer 33 is configured to emit a falling edge simultaneously to the nodes SL and WL. That makes it possible to isolate the elementary component NVM from the node BL and to maintain the logic state of said elementary component at x=0 obtained following the read operation (by charge pumping during the read).

Figure 5A:
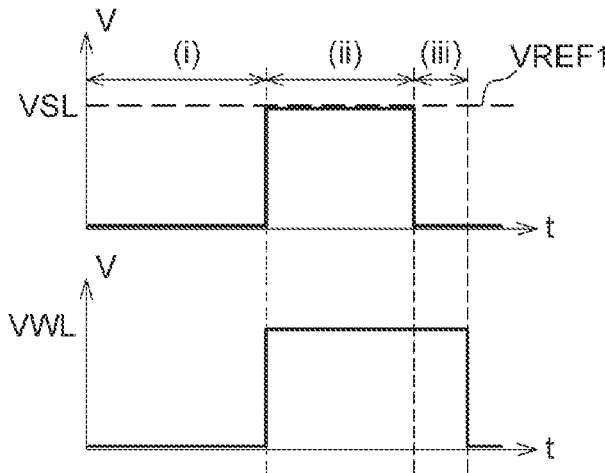
FIG. 5a illustrates a timing diagram of the control signals of the memory cell following the reading of a high logic state (x=1) by the read circuit according to the invention.

Alternatively, FIG. 5a illustrates a timing diagram of the control signals of the memory cell $CM_{ij}$ following the reading of a high logic state (x=1) by the read circuit 3. In this case, the sequencer 33 receives the digital read signal Vs1_cmp=VDD. In response to this result, the sequencer 33 is configured to apply a falling edge to the input/output node SL while maintaining the selection node WL at a high state. The result thereof is the following combination:

on the one hand, the first input/output node SL is at a low potential (preferably zero) under the action of the sequencer 33;

on the other hand, the second input/output node BL is at a high electrical potential equal to VREF1 under the action of the operational amplifier AO; the transistor T1 being in the on state.

That corresponds to the application of a write voltage SET on the elementary component NVM as explained in FIG. 1a. Thus, an operation to rewrite the logic value x=1 has been performed via the action of the sequencer 33 making it possible to perform a rewrite operation by the read circuit itself. That makes it possible to overcome destructive read problems without making the circuit more complex.

Several possible configurations of the read circuit in a step of rewriting following the reading of a logic datum x=1 will be described hereinbelow in a nonlimiting manner.

Figure 5B:
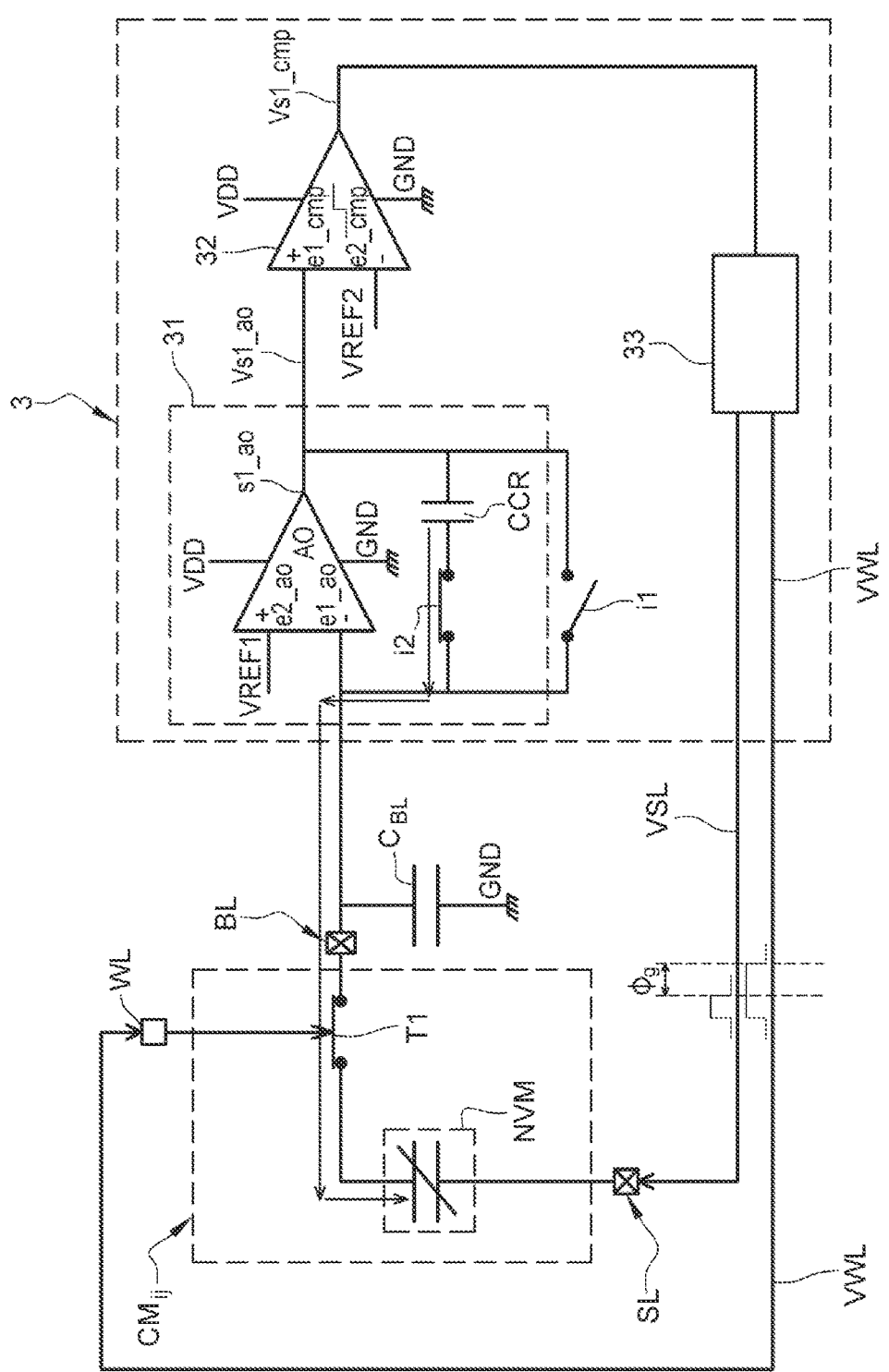
FIG. 5b illustrates an electrical circuit diagram of a first configuration of the read circuit according to the invention in a rewriting step.

FIG. 5b illustrates an electrical circuit diagram of a first configuration of the read circuit 3 according to the invention in a rewriting step. For this configuration, the feedback activation switch i2 is maintained closed during the read step so as to repatriate the charges accumulated in the feedback capacitance CCR to the elementary component NVM. The charges have not been discharged downstream from the capacitive transimpedance amplifier 31. The charges transmitted in the read are repatriated in the memory cell for a rewriting of the information with a lesser energy consumption than in the prior art solution.

Figure 5C:
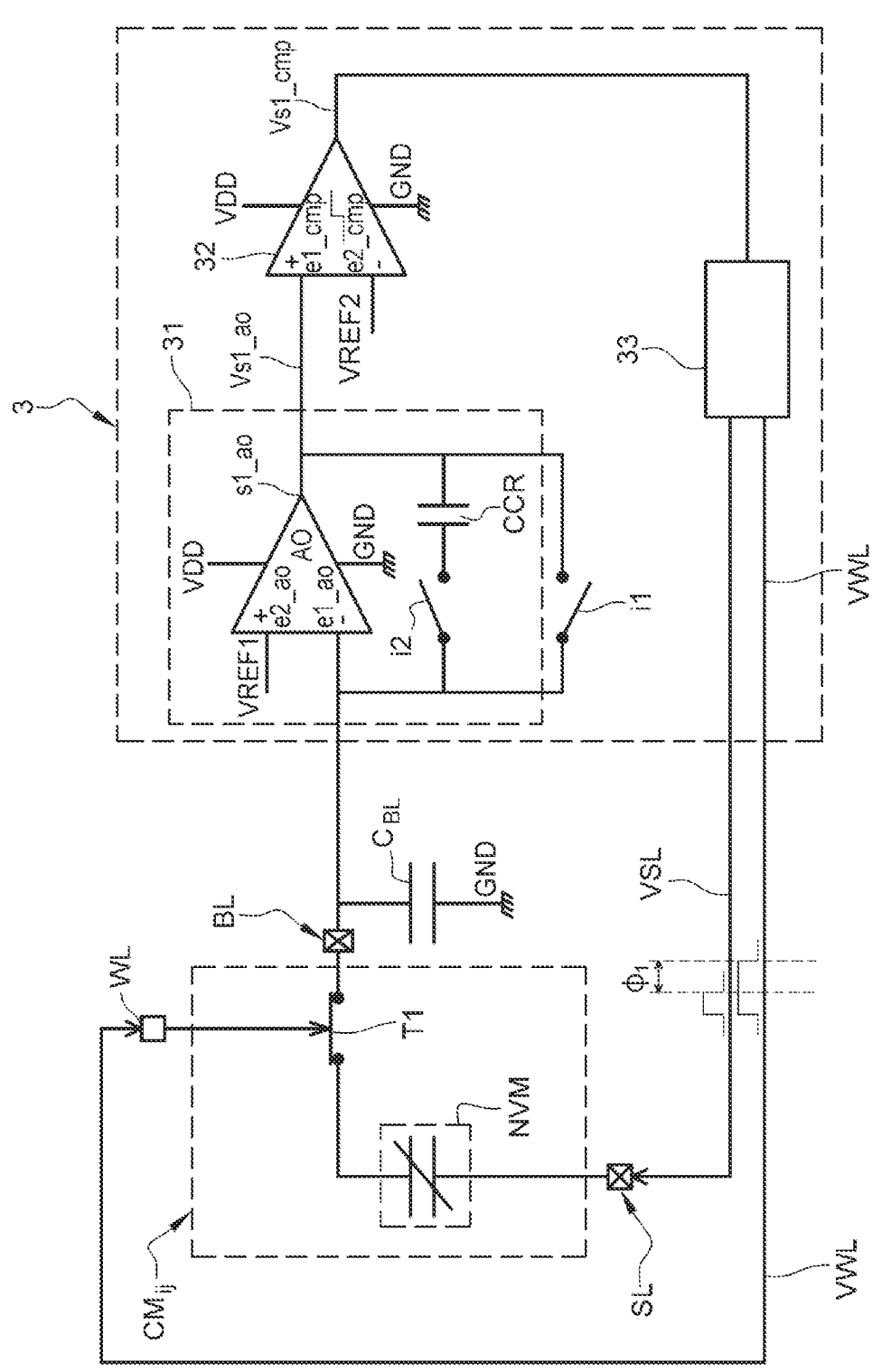
FIG. 5c illustrates an electrical circuit diagram of a first configuration of the read circuit according to the invention in a rewriting step.

FIG. 5c illustrates an electrical circuit diagram of a second configuration of the read circuit according to the invention in a rewriting step. In this second configuration, the feedback activation switch i2 is open. That makes it possible to rewrite the memory cell using the potential difference applied between the nodes SL and BL while keeping a copy of the information read in the feedback capacitive impedance CCR.

FIG. 5d illustrates an electrical circuit diagram of a third configuration of the read circuit according to the invention in a rewriting step. In this second configuration, the feedback activation switch i2 is open and the reset switch i1 is closed. That makes it possible to rewrite the memory cell using the potential difference applied between the nodes SL and BL. This configuration offers a particular advantage in the case where the bitline connected to the node BL is capacitive so as to exhibit a potential that is not equal to the voltage of VREF1. The closing of the reset switch i1 makes it possible to correctly rebias the node BL to the first reference voltage VREF1 via the capacitive transimpedance amplifier 31. That makes it possible to rewrite a high logic state (x=1) more effectively.

Figure 6A:
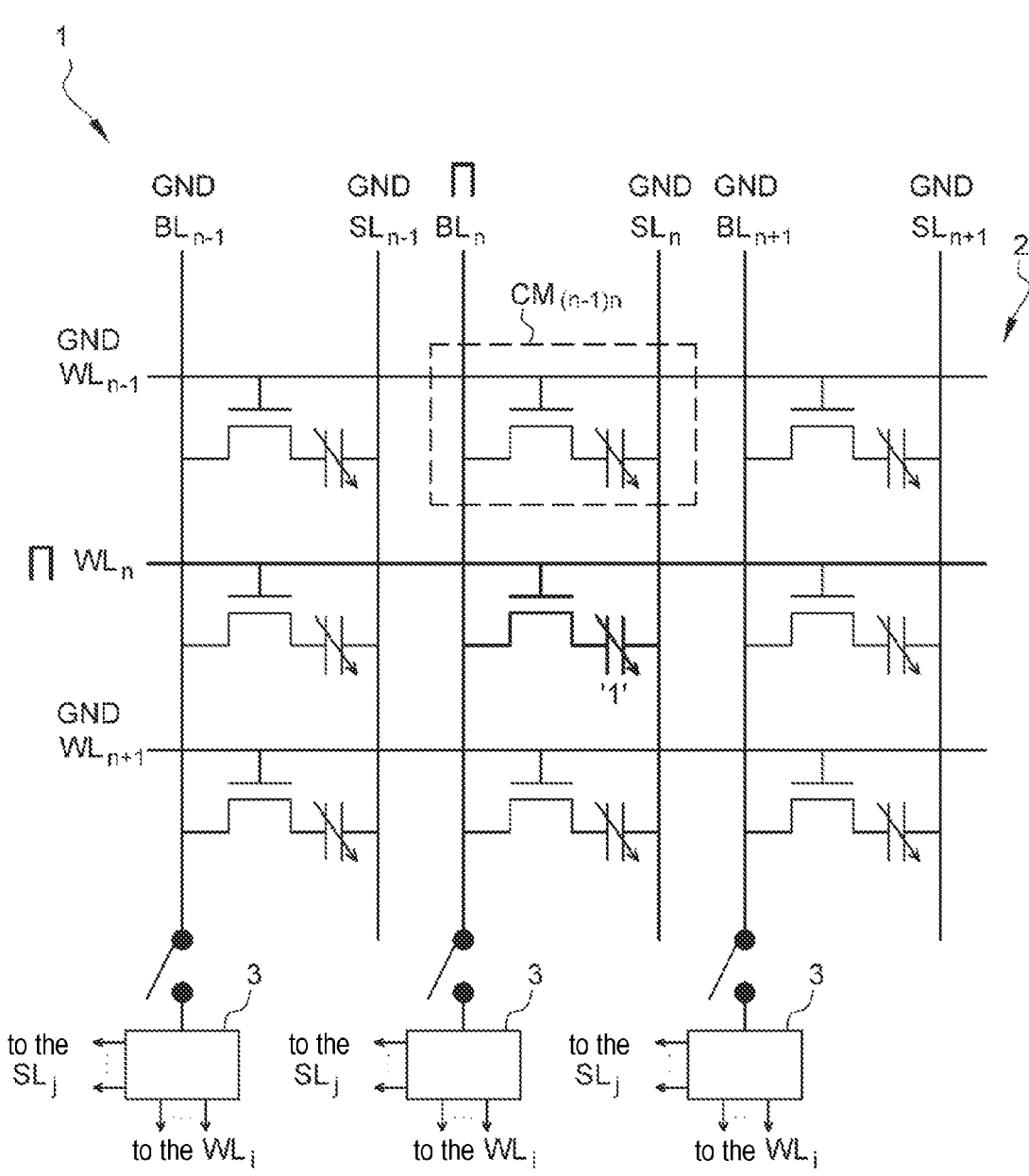
FIG. 6a illustrates a functional diagram of the architecture of a first embodiment of the data storage circuit according to the invention.

FIG. 6a illustrates a first embodiment of the storage circuit 1 according to the invention. The storage circuit 1 according to the invention comprises a matrix of memory cells 2 and a plurality of read circuits 3. The matrix of memory cells comprises N rows and M columns. The memory cells $CM_{ij}$ belonging to one and the same column $C_j$ have first input/output nodes SL that are interconnected via a common source line ($SL_n$ for the column $C_n$). In addition, the memory cells $CM_{ij}$ belonging to one and the same column $C_{ij}$ have second input/output nodes BL that are interconnected via a common bitline ($BL_n$ for the column $C_n$). Also, the memory cells $CM_{ij}$ belonging to one and the same row $L_i$ have selection nodes WL that are interconnected via a common word line ($WL_n$ for the column $L_n$). It is then a matrix structure with bitlines $BL_j$ and source lines $SL_j$ that are parallel in a first direction. The word lines $WL_j$ are orthogonal to said first direction. The storage circuit 1 comprises, at the foot of each column $C_j$, a read circuit 3 according to the invention connected to the bitline $BL_j$ of said column. Each read circuit 3 acts via its feedback loop on the memory cells $CM_{ij}$ belonging to the same column $C_j$ to perform a nondestructive read. This configuration makes it possible to perform a write and a read of a target memory cell $CM_{ij}$ without disturbing the memory cells that are adjacent in row or in column. For that it is sufficient to bias the bitlines $BL_j$ of the memory cells adjacent to the electrical ground GND. Furthermore, this configuration makes it possible to perform writes/reads in parallel of all the memory cells belonging to the same row $L_i$. That parallel operation is possible by virtue of the independence between the bitlines $BL_j$ and the source lines $SL_j$ of this set of memory cells.

The storage circuit 1 further comprises write means that are not represented in the interests of simplification. The write means are distinct from the read circuit according to the invention. The write means are configured to perform data write operations and are not involved in the rewrite operations in response to a destructive read previously illustrated in the context of the invention.

Figure 6B:
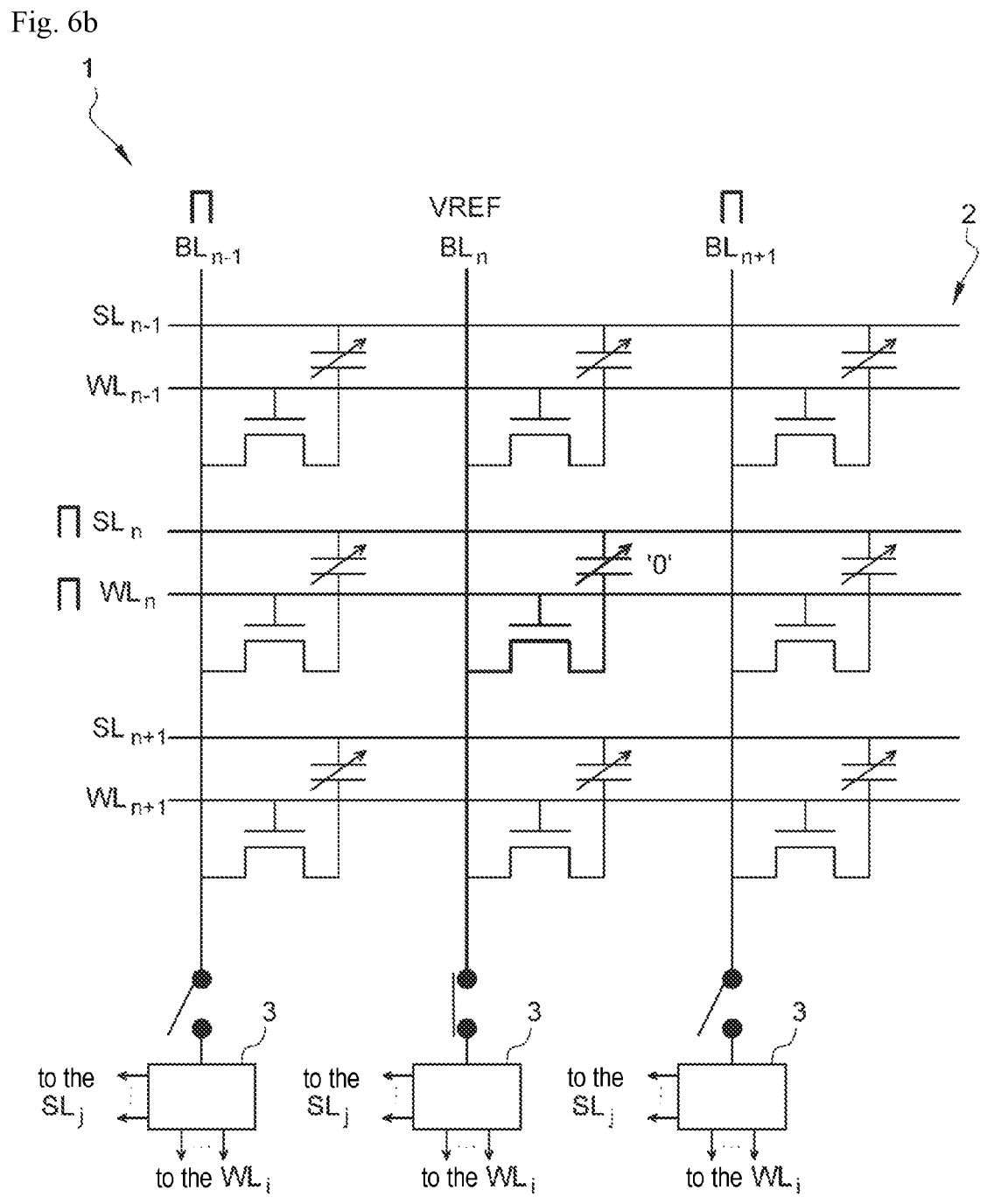

FIG. 6b illustrates a second embodiment of the storage circuit 1 according to the invention. The second embodiment differs from the first by the different orientation of the source lines $SL_n$, $SL_{n-1}$, $SL_{n+1}$. Indeed, in this embodiment, the source lines are common to the memory cells $CM_{ij}$ belonging to the same row $L_i$. Thus, the source lines $SL_i$ extend in a direction orthogonal to that of the bitlines $BL_j$ and parallel to that of the word lines $WL_i$. This configuration is compatible with the invention provided that inhibiting signals are applied to the bitlines $BL_j$ of the other columns $C_j$ different from that of the memory cell selected for a read operation. That makes it possible to avoid the disturbances of the state of the memory cells $CM_{ij}$ belonging to the same row of the target memory cell when it is being read.

The next section will describe an embodiment of the invention when the data storage circuit 1 comprises memory cells of resistive memory type with variable conductive filament (OxRAM for example). The resistive memory cells with variable conductive filament can be co-integrated with the ferroelectric memory cells in the same matrix 2. Alternatively, the resistive memory cells with variable conductive filament can be integrated in a second matrix distinct from the matrix 2. Alternatively, it is possible to reconfigure the ferroelectric memory cells according to an operation of resistive type with variable conductive filament as described in FIG. 7a.

Figure 7A:
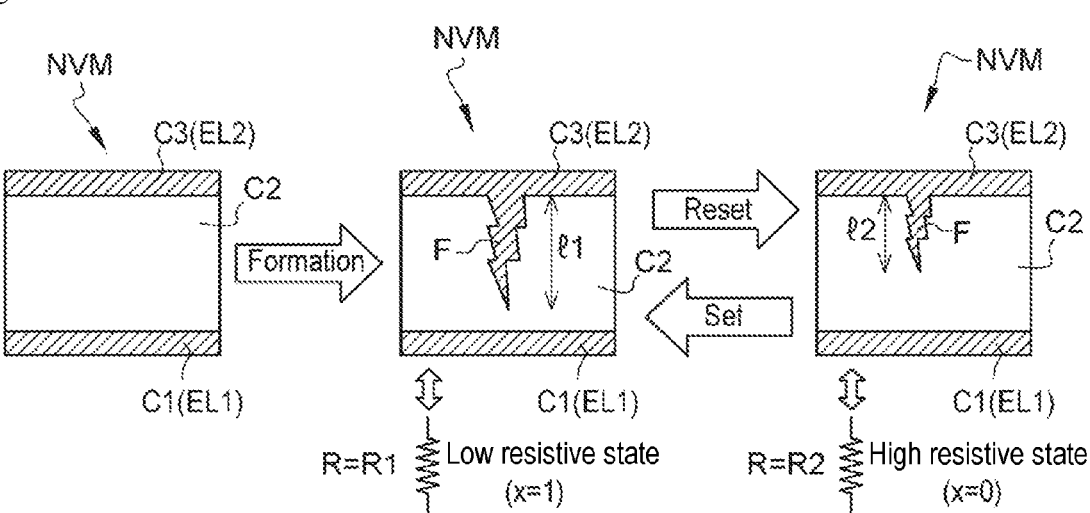
FIG. 7a illustrates a cross-sectional view of an example of an elementary component of a resistive memory cell with variable conductive filament that is compatible with the invention.

FIG. 7a illustrates an elementary component NVM of a resistive memory cell with variable conductive filament that is compatible with the invention. The resistive operation with variable conductive filament necessitates the formation of a conductive filament F through at least a part of the electrically insulating central layer C2.

Initially, the elementary component NVM is a structure of MIM (metal, insulator, metal) type having an infinite resistance between the two electrodes EL1 and EL2. In order to reconfigure the elementary component NVM according to a resistive memory mode operation, the filament F must be formed starting from the top electrode EL2 through at least a part of the volume of the central layer C2. The formation of the filament makes it possible to obtain a variable resistance by modulating the length l of the conductive filament formed. To form the filament, an electrical formation voltage is applied to the top electrode EL2. The electric formation voltage has an amplitude and/or a duration that is high enough to result in the generation of oxygen deficiencies in the central layer C2. Indeed, the electrical formation voltage applied must exceed a predetermined value so as to tear away oxygen ions from the crystalline network of the central layer made of metallic oxide which will migrate to the top electrode EL2 and thus form a conductive filament F through the central layer composed of oxygen deficiencies.

Once the conductive filament F is formed, the resistive element behaviour is obtained with a variable resistance R dependent on the length l of the conductive filament F. When a positive electrical voltage is applied to the bottom electrode EL1, it is the reverse reaction which occurs and oxygen ions come to fill a part of the oxygen deficiencies forming the conductive filament. The result thereof is a reduction of the length of the conductive filament. Thus, the resistance of the resistive element increases. This is referred to as a high resistive state and a write operation of RESET type. Conversely, when a positive electrical voltage is applied to the top electrode EL2, the length of the conductive filament F increases by the same mechanism described for the thread formation operation. Thus, the resistance of the resistive element decreases. This is referred to as a low resistive state and a write operation of SET type.

The following convention is chosen by way of example: when a memory component NVM is configured to store a binary datum in the high logic state (x=1), a write electrical voltage is applied temporarily to the top electrode EL2 (SET operation) so as to obtain a low resistive state. Conversely, when a memory component NVM is configured to store a binary datum in the low logic state (x=0), a write electrical voltage is applied temporarily to the bottom electrode EL1 (RESET operation) so as to obtain a high resistive state.

The reading of a resistive memory component NVM consists in estimating the resistance between the top electrode and the bottom electrode and in comparing it to a threshold value to determine whether the resistive state is a high or low state.

Figure 7B:
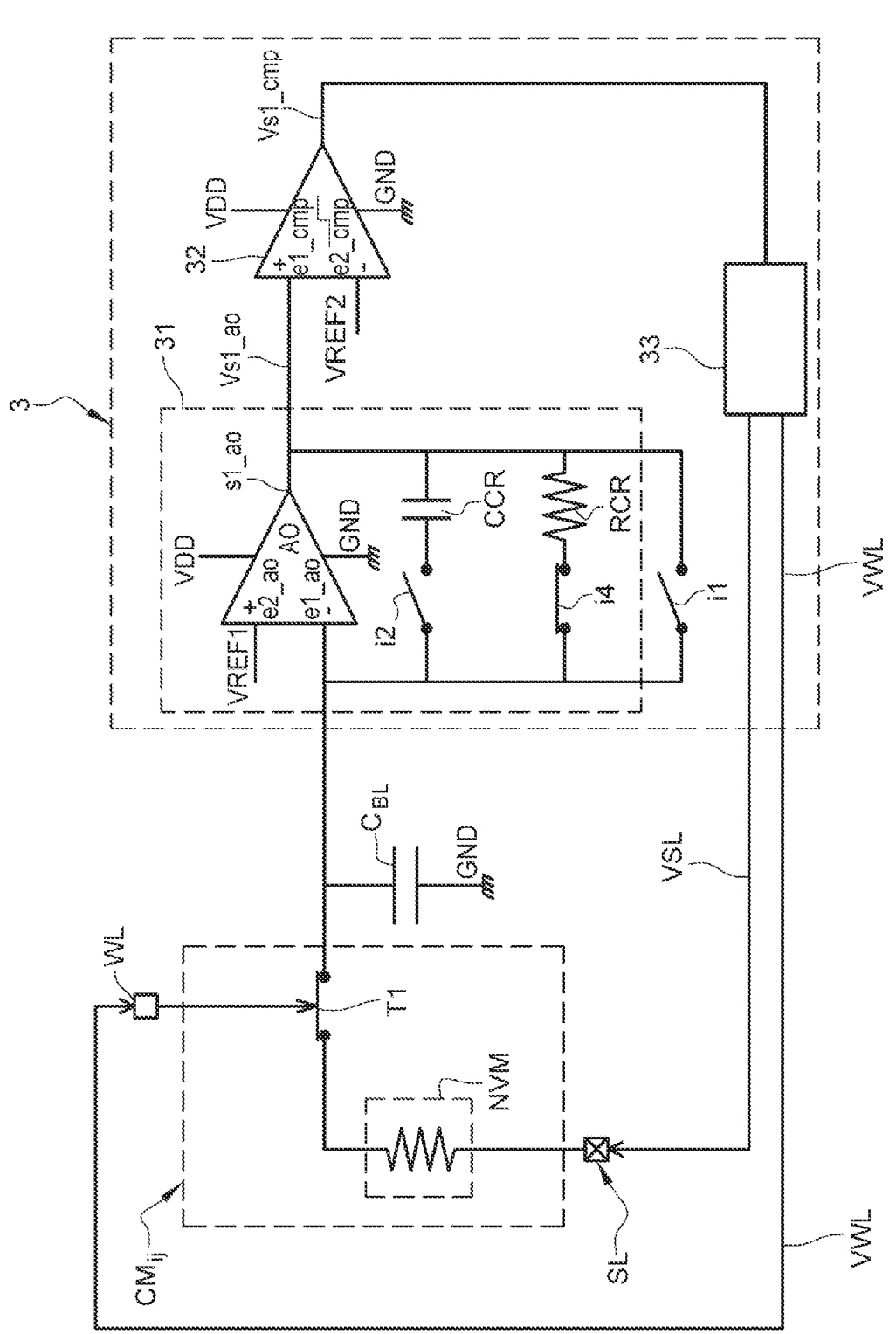
FIG. 7b illustrates an electrical circuit diagram of a second embodiment of the read circuit according to the invention connected to a resistive memory cell with variable conductive filament.
Figure 7C:
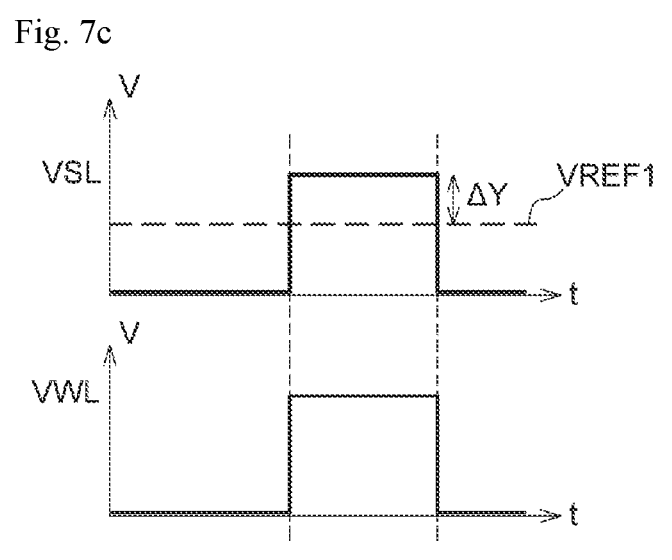

FIG. 7b illustrates an electrical circuit diagram of a second embodiment of the read circuit 3 according to invention connected to a resistive memory cell with variable conductive filament. FIG. 7c illustrates a timing diagram of the control signals of the resistive memory cell when a memory cell is being read by the read circuit according to the invention.

In this embodiment, the elementary component NVM behaves as a resistor. The read circuit 3 further comprises a feedback resistive impedance RCR mounted between the output s1_ao and the first input e1_ao of the operational amplifier AO.

Advantageously, the read circuit 3 comprises a second feedback activation switch i4 between the feedback resistive impedance RCR and the first input e1_ao of the operational amplifier AO.

To read the logical content of the resistive memory cell $CM_{ij}$, the second feedback activation switch i4 is in the on state and the first feedback activation switch i2 is in the off state. The sequencer 33 is configured to apply a positive read control signal VSL to the first input/output node SL with the transistor T1 in the on state. The amplitude of the positive read control signal VSL is greater than that of the first reference signal VREF1 (potential of the second node BL). The resistive elementary component NVM is then subjected to a non-zero potential difference. The result thereof is the circulation of an electrical current I1 through the NVM resistance and the feedback resistive impedance RCR. The intensity of the current I1 depends on the resistive state of the filament of the elementary component NVM. That induces a variation of the voltage VRCR at the terminals of the feedback resistive impedance RCR which depends on the intensity of the current I1. The result thereof is a variation of the electrical potential at the output node s1_ao of the operational amplifier AO. This voltage variation is an image of the resistive state of the elementary component NVM according to the logic content stored in said component. The reading of an elementary component NVM is not destructive of the logic content of the memory cell. There is no need for a rewrite step in this case.

The invention claimed is:

1. A data storage circuit comprising:
a matrix of memory cells such that each memory cell (CMij) comprises:
an elementary storage component (NVM) of ferroelectric type with variable electric polarisation and having a first electrode (EL1) and a second electrode (EL2);
a first input/output node (SL) connected to the second electrode (EL2);
a second input/output node (BL); a selection node (WL); and
a selection transistor (T1) having a gate connected to the selection node (WL) and linking the first electrode (EL1) to the second input/output node (BL), wherein each memory cell has a first ("0") or a second ("1") logic state corresponding respectively to different levels of charges stored in the elementary storage component (NVM);
a read circuit associated with at least one memory cell of the matrix of memory cells, comprising:
a capacitive transimpedance amplifier stage configured to read a datum stored in a selected memory cell (CMij) of the matrix of memory cells selected via the switching-on of a corresponding selection transistor (T1) by applying a selection signal (VWL) to a selection node (WL), said capacitive transimpedance amplifier stage comprising:
an operational amplifier (AO) having: a first input (e1_ao) connected to the second input/output node (BL) of the selected memory cell, a second input (e2_ao) for receiving a first reference signal (VREF1); and an output (s1_ao) for supplying an analog read signal (Vs1_ao); and a feedback capacitive impedance (CCR) mounted between the output (s1_ao) and the first input (e1_ao) of the operational amplifier; and a sequencer circuit configured to, following the reading of a datum corresponding to the second logic state ("1"), apply a control signal (VSL) to the first input/output node (SL) having an amplitude lower than the first reference signal (VREF1) and maintain the selection transistor (T1) in an on state so as to replace, in the elementary storage component (NVM) of the selected memory cell, a level of charges corresponding to the second logic state ("1").

2. The data storage circuit according to claim 1, wherein said sequencer circuit is configured to, during the reading, apply a control signal (VSL) to the first input/output node (SL) having an amplitude substantially equal to that of the first reference signal (VREF1) so as to create a transfer of charges from the elementary storage component (NVM) of the selected cell to said capacitive transimpedance amplifier stage.

3. The data storage circuit according to claim 2, wherein said first logic state ("0") corresponds to a non-charged state of an elementary storage component (NVM), and wherein said sequencer circuit is such that, following the reading of a datum corresponding to a first logic state ("0"), said sequencer circuit is configured to switch off said selection transistor (T1) of the selected memory cell (CMij) before modifying the control signal (VSL) on the first input/output node (SL) to a new value, to maintain the memory cell that has just been read in a non-charged state.

4. The data storage circuit according to claim 1, wherein the read circuit further comprises a comparator having:

a first input (e1_cmp) connected to the output (s1_ao) of the operational amplifier;

a second input (e2_cmp) for receiving a second reference signal (VREF2); and an output (s1_cmp) for supplying a digital read signal (Vs1_cmp).

5. The data storage circuit according to claim 1, wherein:

the control signal (VSL) is a first pulse;

the selection signal (VWL) is a second pulse; and the sequencer circuit is configured to reduce the duration of the first pulse with respect to that of the second pulse following the reading of a datum corresponding to a high logic state.

6. The data storage circuit according to claim 1, wherein the read circuit further comprises a reset switch (i1) mounted between the output (s1_ao) and the first input (e1_ao) of the operational amplifier.

7. The data storage circuit according to claim 1, wherein the read circuit further comprises a first feedback activation switch (i2) between the feedback capacitive impedance (CCR) and the first input (e1_ao) of the operational amplifier.

8. The data storage circuit according to claim 1, further comprising a read activation switch (i3) between the first input (e1_ao) of the operational amplifier and the second input/output node (BL) of the associated memory cell.

9. The data storage circuit according to claim 3, wherein the read circuit is configured to further perform, before the reading of said associated memory cell:

a reset step for discharging the feedback capacitive impedance (CCR) and biasing the first input (e1_ao) of the operational amplifier to the first reference signal (VREF1).

10. The data storage circuit according to claim 1, wherein the amplitude of the first reference signal (VREF1) lies within the interval [VDD/2−VDD/4; VDD/2+VDD/4] with VDD a power supply voltage of the data storage circuit.

11. The data storage circuit according to claim 1, further comprising at least one elementary storage component (NVM) that can be configured according to an operating configuration corresponding to a resistive memory with variable conductive filament, wherein the read circuit further comprises:

a feedback resistive impedance (RCR) mounted between the output (s1_ao) and the first input (e1_ao) of the operational amplifier (AO); and a second feedback activation switch (i4) between the feedback resistive impedance (RCR) and the first input (e1_ao) of the operational amplifier (AO).

12. The data storage circuit according to claim 1, wherein the matrix of memory cells comprises N rows and M columns such that:

the memory cells (CMij) belonging to one and the same column have first input/output nodes (SL) are interconnected, and second input/output nodes (BL) are interconnected; and the memory cells (CMij) belonging to one and the same row have selection nodes (WL) are interconnected.

13. The data storage circuit according to claim 1, wherein the elementary storage component (NVM) is of FeRAM type or of ferroelectric tunnel junction (FTJ) type.

* * * * *